United States Patent [19]
Hao et al.

[11] Patent Number: 6,100,117
[45] Date of Patent: Aug. 8, 2000

[54] METHOD FOR MANUFACTURING DRAM HAVING A REDUNDANCY CIRCUIT REGION

[75] Inventors: Chung Peng Hao, Taipei; Chung Lin Huang, Taichung; Lee Chung Yuan, Taoyuan; Pei-Ing Lee, Taipei Hsien; Wu Hsiung Chen, Hsinchu, all of Taiwan

[73] Assignee: Nanya Technology Corp., Taiwan

[21] Appl. No.: 09/062,639

[22] Filed: Apr. 20, 1998

[30] Foreign Application Priority Data

Mar. 20, 1998 [TW] Taiwan ................................. 87104226

[51] Int. Cl.[7] ......................................................... H01L 21/82
[52] U.S. Cl. ........................ 438/132; 438/601; 438/239; 257/529; 257/296
[58] Field of Search ................................... 438/254, 255, 438/397, 396, 601, 706, 239, 132; 257/529; 365/225.1

[56] References Cited

U.S. PATENT DOCUMENTS

| | | | |
|---|---|---|---|
| 5,303,199 | 4/1994 | Ishihara et al. | 365/225.1 |
| 5,821,160 | 10/1998 | Rodriguez et al. | 438/601 |
| 5,891,762 | 4/1999 | Sakai et al. | 438/132 |
| 5,914,524 | 6/1999 | Komenaka | 257/529 |
| 5,955,380 | 9/1999 | Lee | 438/706 |
| 5,972,756 | 10/1999 | Kono et al. | 438/281 |

*Primary Examiner*—Olik Chaudhuri
*Assistant Examiner*—William David Coleman
*Attorney, Agent, or Firm*—Michael D. Bednarek; Shawpittman

[57] ABSTRACT

A method for manufacturing DRAM having a redundancy circuit region. The method utilizes a laser beam permeable layer such as a silicon nitride layer to serve as a stop layer in the etching step of the passivation oxide layer. The method removes the conductive layer, serving as the upper electrode of the capacitor, in the redundancy circuit region II. The fuse of the redundancy circuit region II can thereby be easily blown by the laser beam.

16 Claims, 8 Drawing Sheets

METHOD FOR MANUFACTURING DRAM HAVING A REDUNDANCY CIRCUIT REGION

BACKGROUND OF THE INVENTION

1. Field of the Invention

The present invention relates to a method for manufacturing a dynamic random access memory (DRAM), and more particularly to a method for manufacturing DRAM having a redundancy circuit region, which can obtain better controllability when the fuse is blown by a laser beam.

2. Description of the Prior Art

Referring to FIGS. 1A through FIG. 1H, the cross-sectional side views of a conventional method for manufacturing a DRAM having a redundancy circuit are depicted in sequence.

Referring now to FIG. 1A, a cross-sectional view of the starting semiconductor substrate 10 including a memory cell region I and a redundancy circuit region II is schematically shown. A field oxide 12 (FOX) is formed by using conventional local oxidation of silicon (LOCOS). Then, the gate electrode G and the spacer 19 are formed on the semiconductor substrate 10. Next, the silicon nitride thin layer 22 is formed on the upper surface and the side wall of the gate electrode G. The gate electrode G consists of the gate oxide 14, the polysilicon layer 16, polycide layer 18, and the silicon oxy-nitride layer 20.

Subsequently, the insulated layer 24, for example borophosphosilicate glass (BPSG), is formed by chemical vapor deposition (CVD). Then, the insulated layer 24 is selectively etched to form a hole, and a conductive material is filled into the hole so as to form the conductive contacts 26a, 26b, 26c. Afterward, the non-doped silicon glass (NSG) layer 28 is formed. Moreover, a complex layer of polysilicon and polycide is formed, then the complex layer is selectively etched to form the bit line B consisting of the polysilicon 32a and the polycide 34a in the memory cell region I, and the fuse F consisting of the polysilicon 32b and the polycide 34b in the redundancy circuit region II. The bit line B is electrically connected with the conductive contact 26b via the conductive plug 30.

Next, as shown in FIG. 1B, the insulated layer 36, for example silicon oxide, is now formed by high-density plasma chemical vapor deposition (HDPCVD), then polished by chemical mechanical polishing (CMP). The nitride layer 38 is then formed.

Now as shown in FIG. 1C, the capacitor contact hole 39 is formed. The capacitor contact hole 39 is etched open in the silicon nitride layer 38, the insulated layer 36, and the NSG layer 28 by photolithography techniques and anisotropic etching.

Referring now to FIG. 1D, the insulated layer 40 is deposited, for example by chemical vapor deposition (CVD). The preferred thickness of the insulated layer 40 is usually in the range from between about 8,000 to 12,000 angstroms.

Now as shown in FIG. 1E, the trench is formed by selectively etching the insulated layer 40 in the position above the contact hole 39 to expose the silicon nitride layer 38, and the insulated layer 40 filled in the contact hole 39 is removed at the same time. The conductive material 41 is filled in the contact hole 39, and the conductive material 42 is deposited all over the side wall and the bottom of the trench. The conductive material 42, for example is a polysilicon, and serves as a lower electrode of a crown capacitor.

Referring to FIG. 1F, the thin dielectric layer 44 is formed on the conductive material 42. The dielectric layer 44 is for example a complex layer of oxide/nitride/oxide (ONO). The conductive layer 46, for example a polysilicon layer, is then deposited.

Next, referring to FIG. 1G, the conductive layer 46 is patterned to form an upper electrode 46a of the capacitor in the memory cell region I, and an etching stop layer 46b in the redundancy circuit region II. Afterward, the oxide passivation layer 48 is formed to cover the upper electrode 46a and the etching stop layer 46b. The conductive line 54 is then formed on the oxide passivation layer 48, and is connected with the upper electrode 46a via the metal plug 52. The oxide passivation layer 50 is then formed over the oxide passivation layer 48.

Finally, as shown in FIG. 1H, by using the etching stop layer 46b as a stop layer, the oxide passivation layer 50 and 48 are etched to form a trench 56 above the fuse F in the redundancy circuit region II.

However, the distance D1 between the fuse F and the etching stop layer 46b as shown in FIG. 1H is too large. Therefore, the fuse F can not be easily blown by a laser beam. Furthermore, the laser beam can not pass through the etching stop layer 46b made of polysilicon, thereby causing increasing a step for removing the etching stop layer 46b before blowing the fuse F.

SUMMARY OF THE INVENTION

In view of the above disadvantage, an object of the invention is to provide a method for manufacturing DRAM having a redundancy circuit region. The fuse of the redundancy circuit region II can be easily blown by a laser beam.

The above object is attained by providing a method for manufacturing a DRAM having a redundancy circuit region, comprising the steps of: (a) providing a semiconductor substrate having a memory cell region and a redundancy circuit region; (b) forming a first insulated layer over said semiconductor substrate of said two regions; (c) forming a first conductive layer on said first insulated layer to serve as a bit line in said memory cell region, and as a fuse in said redundancy circuit region; (d) forming a second insulated layer over said first conductive layer of said two regions; (e) forming an etching stop layer on said second insulated layer of said two regions; (f) forming a lower electrode of the capacitor in said memory cell region; (g) forming a dielectric layer on the surface of said lower electrode; (h) forming a second conductive layer in said two regions; (i) selectively etching said second conductive layer, to form a upper electrode of the capacitor in said memory cell region, and removing said second conductive layer in the redundancy circuit region; and (j) forming at least one passivation layer.

Furthermore, the above object is attained by providing a method for manufacturing a DRAM having a redundancy circuit region, comprising the steps of: (a) providing a semiconductor substrate having a memory cell region and a redundancy circuit region; (b) forming a first insulated layer over said semiconductor substrate of said two regions; (c) forming a polysilicon/polycide layer on said first insulated layer; (d) selectively etching said polysilicon/polycide layer, serving as a bit line in said memory cell region, and as a fuse in said redundancy circuit region; (e) forming a second insulated layer over said polysilicon/polycide layer of said two regions; (f) forming a laser beam permeable etching stop layer on said second insulated layer of said two regions; (g) forming a crown lower electrode of the capacitor in said memory cell region; (h) forming a dielectric layer on the surface of said lower electrode; (i) forming a polysilicon layer in said two regions; (j) selectively etching said polysilicon layer of said memory cell region, to form a upper electrode of the capacitor, and removing said polysilicon layer of the redundancy circuit region; and (k) forming at least one passivation oxide layer.

BRIEF DESCRIPTION OF THE DRAWINGS

The preferred embodiment of the invention is hereinafter described with reference to the accompanying drawings in which.

DETAILED DESCRIPTION OF THE PREFERRED EMBODIMENTS

The preferred embodiment of the invention is illustrated in FIGS. 2A through FIG. 2H of the drawings. FIGS. 2A through FIG. 2H are cross-sectional side views showing the manufacturing steps of a DRAM having a redundancy circuit of a preferred embodiment of the invention.

Figure 1A:
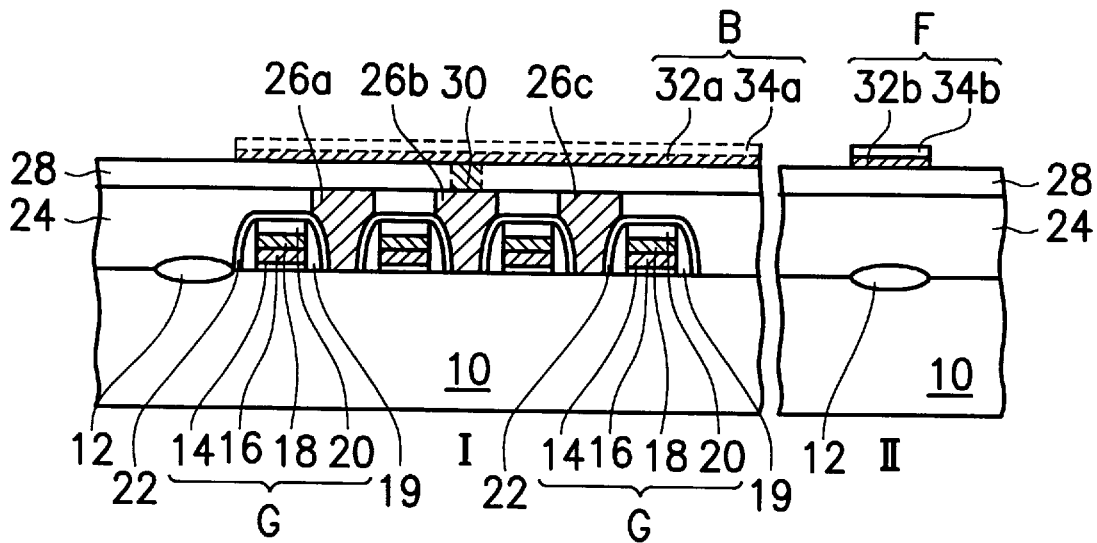
FIGS. 1A through FIG. 1H are cross-sectional side views showing the manufacturing steps of a DRAM having a redundancy circuit of the prior art.
Figure 1B:
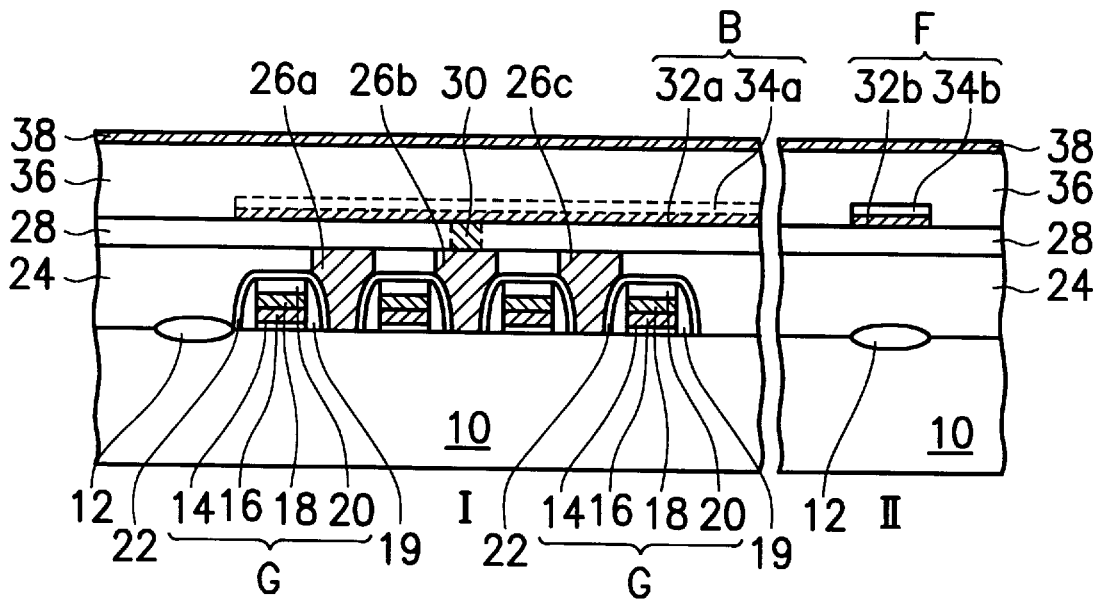
Figure 1C:
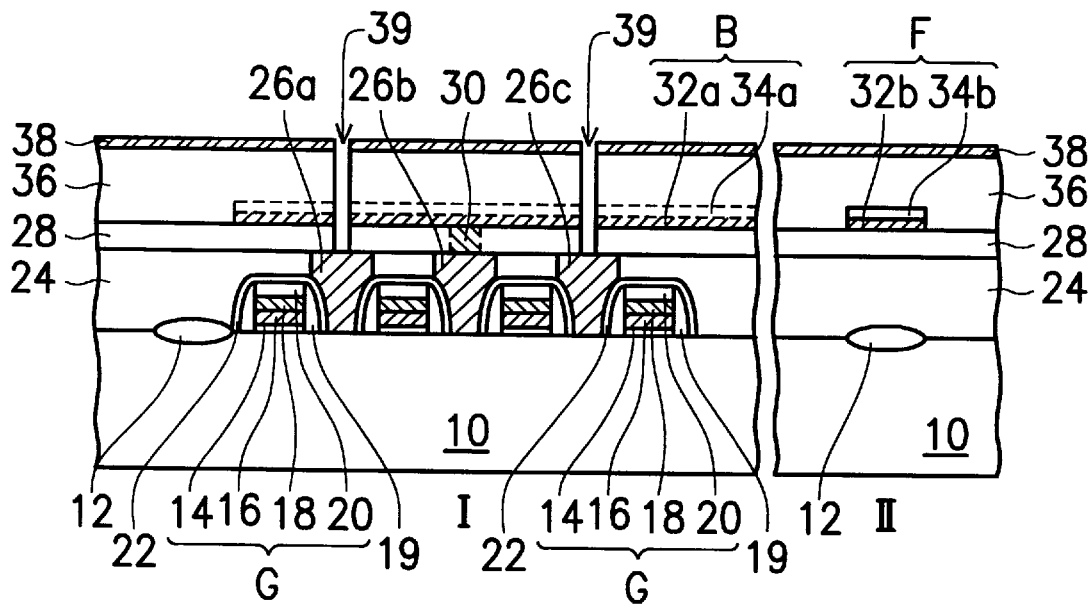
Figure 1D:
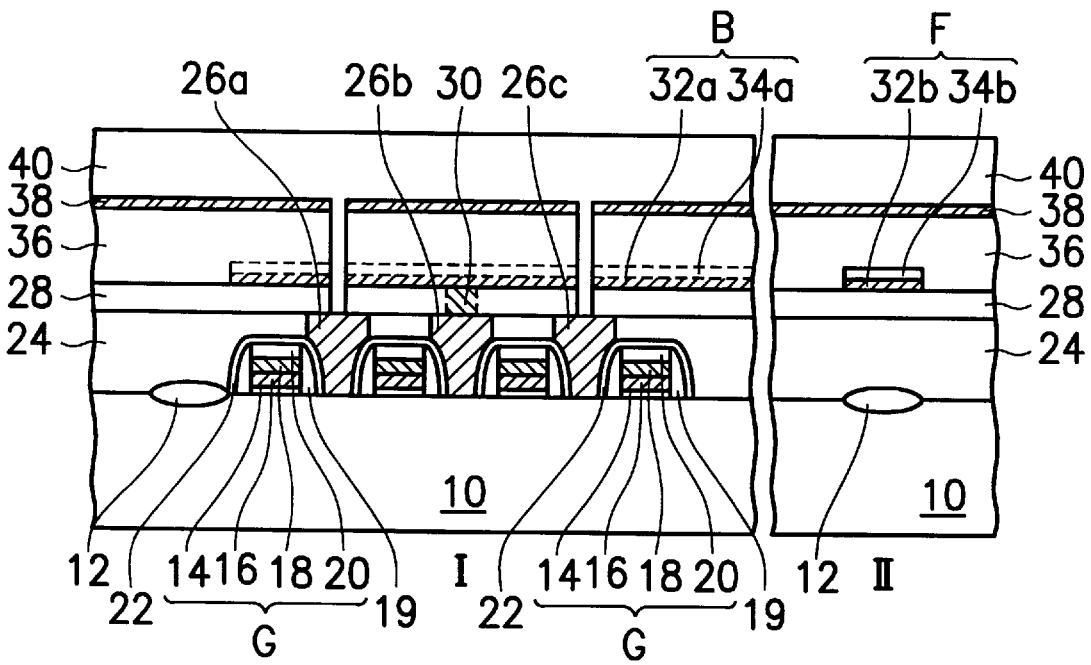
Figure 1E:
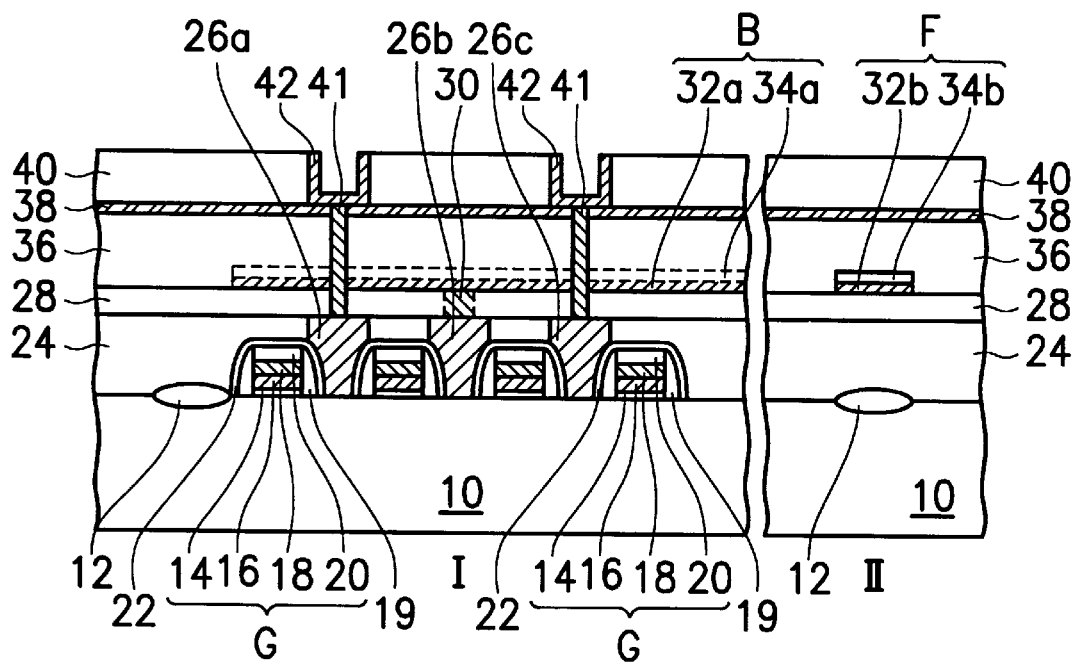
Figure 1F:
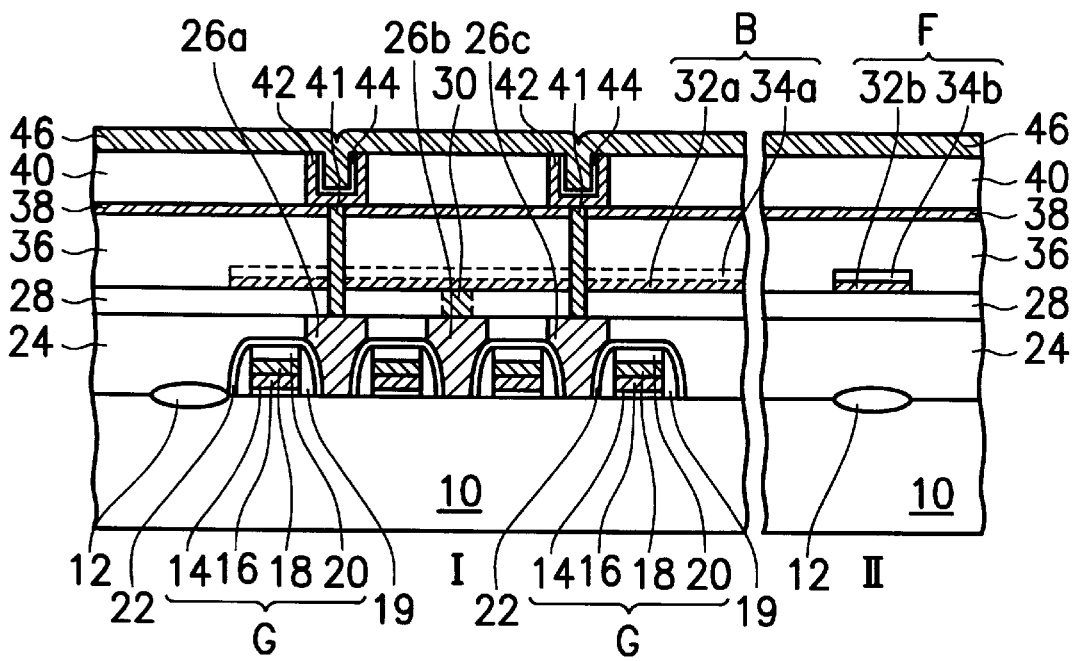
Figure 1G:
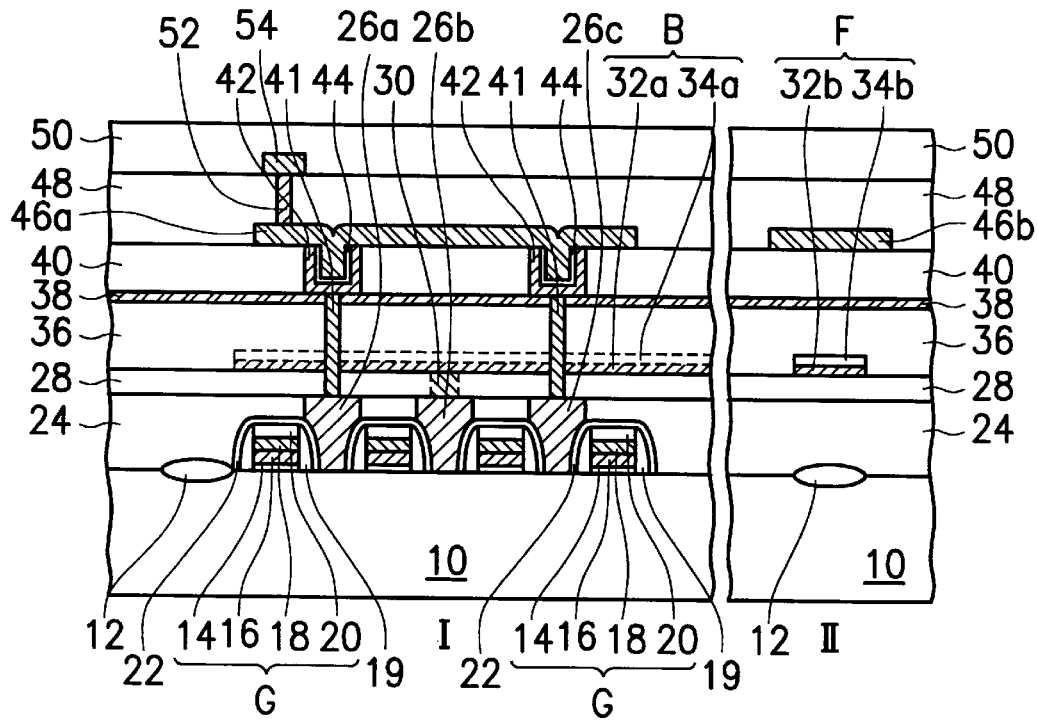
Figure 1H:
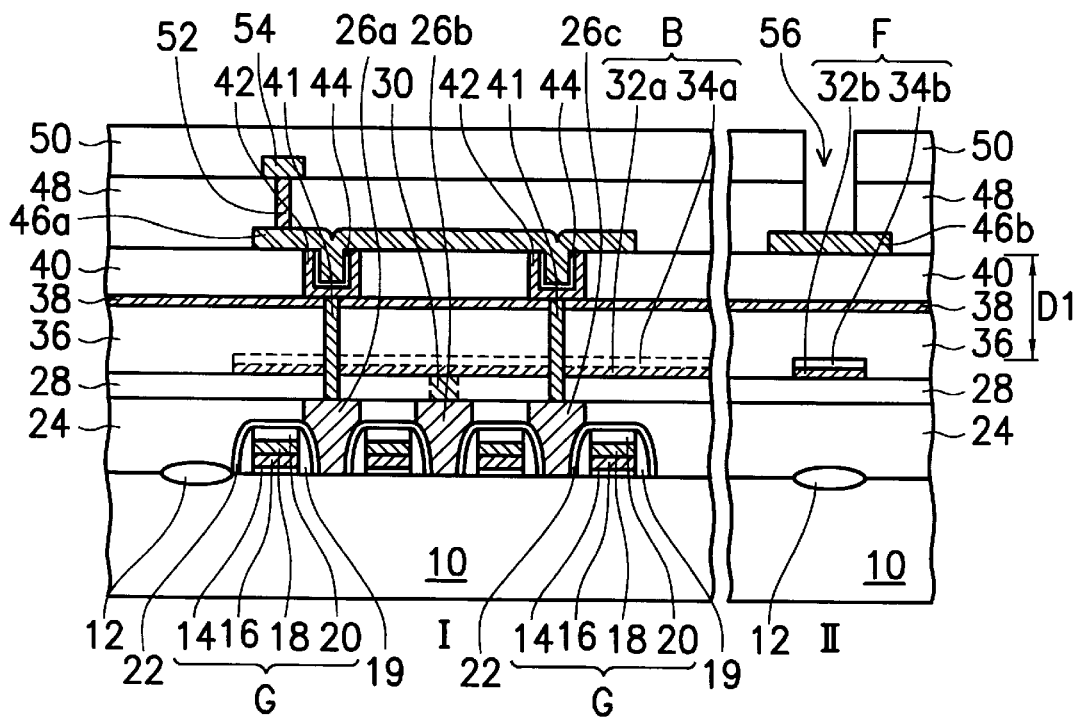
Figure 2A:
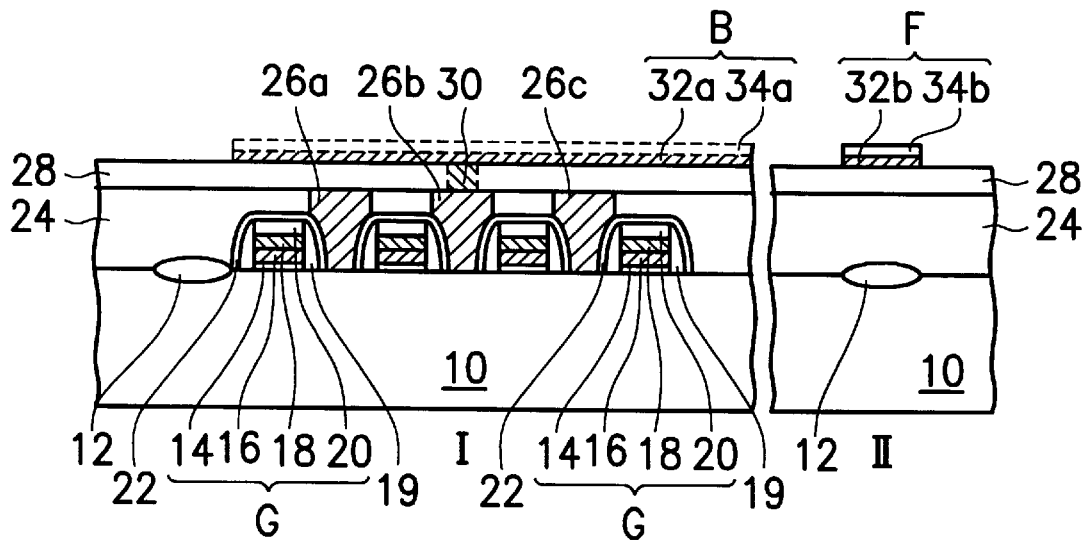
FIGS. 2A through FIG. 2H are cross-sectional side views showing the manufacturing steps of a DRAM having a redundancy circuit of a preferred embodiment of the invention.

Referring now to FIG. 2A, a cross-sectional view of the starting semiconductor substrate 10 including a memory cell region I and a redundancy circuit region II is schematically shown. A field oxide 12 (FOX) is formed surrounding the electrically isolating the active device areas using local oxidation of silicon (LOCOS). Then, the gate electrode G and the spacer 19 are formed on the semiconductor substrate 10. Next, the silicon nitride thin layer 22 is formed on the upper surface and the side wall of the gate electrode G. The gate electrode G consists of the gate oxide 14, the polysilicon layer 16, polycide layer 18, and the silicon oxy-nitride layer 20.

Subsequently, the insulated layer 24, for example borophosphosilicate glass (BPSG), is formed by chemical vapor deposition (CVD). Then, the insulated layer 24 is selectively etched to form a hole, and a conductive material is filled into the hole so as to form the conductive contacts 26a, 26b, 26c. Afterward, the non-doped silicon glass (NSG) 28 is formed. Moreover, a complex layer of polysilicon and polycide is formed, then the complex layer is selectively etched to form the bit line B consisting of the polysilicon 32a and the polycide 34a in the memory cell region I, and the fuse F consisting of the polysilicon 32b and the polycide 34b in the redundancy circuit region II. The bit line B is electrically connected with the conductive contact 26b via the conductive plug 30.

Figure 2B:
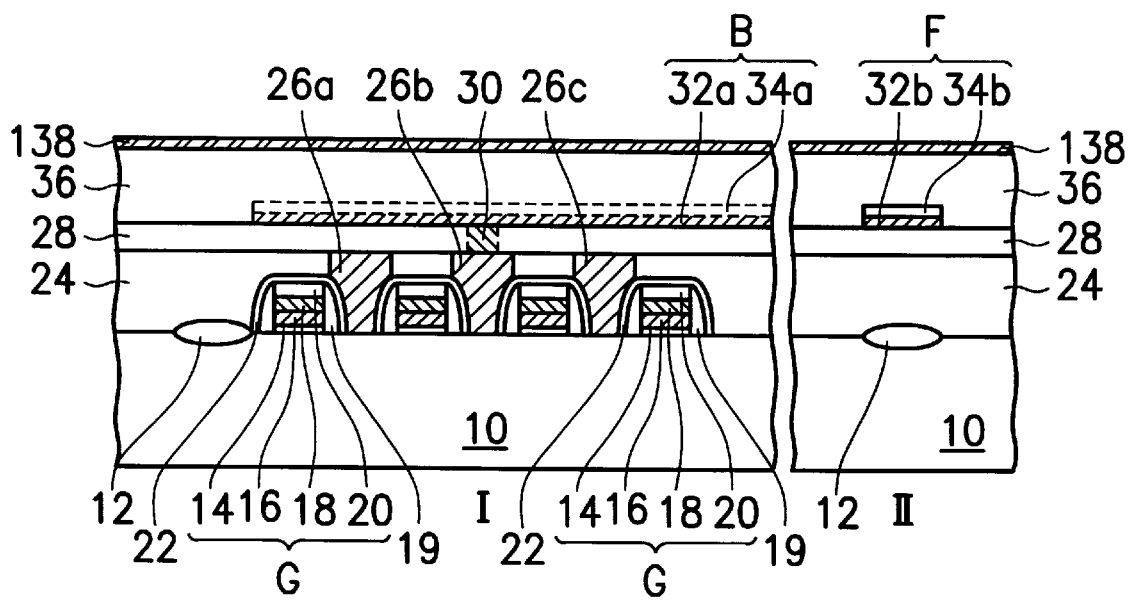

Next, as shown in FIG. 2B, the insulated layer 36, for example silicon oxide, is now formed by high density plasma chemical vapor deposition (HDPCVD), then polished by chemical mechanical polishing (CMP). The etching stop layer 138, for example silicon nitride layer, is then formed. The etching stop layer 138 is typically somewhere between 1000 and 1500 angstroms thick.

Figure 2C:
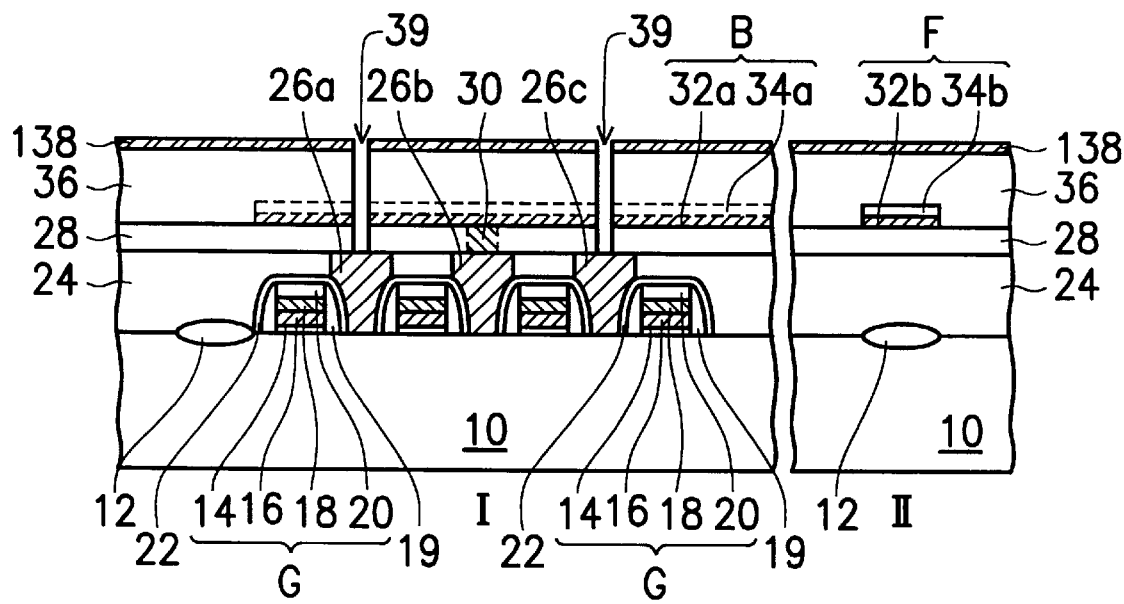

Now as shown in FIG. 2C, the capacitor contact hole 39 is now formed. The capacitor contact hole 39 is etched open in the etching stop layer 138, the insulated layer 36, and the NSG layer 28 using conventional photolithography techniques and anisotropic etching.

Figure 2D:
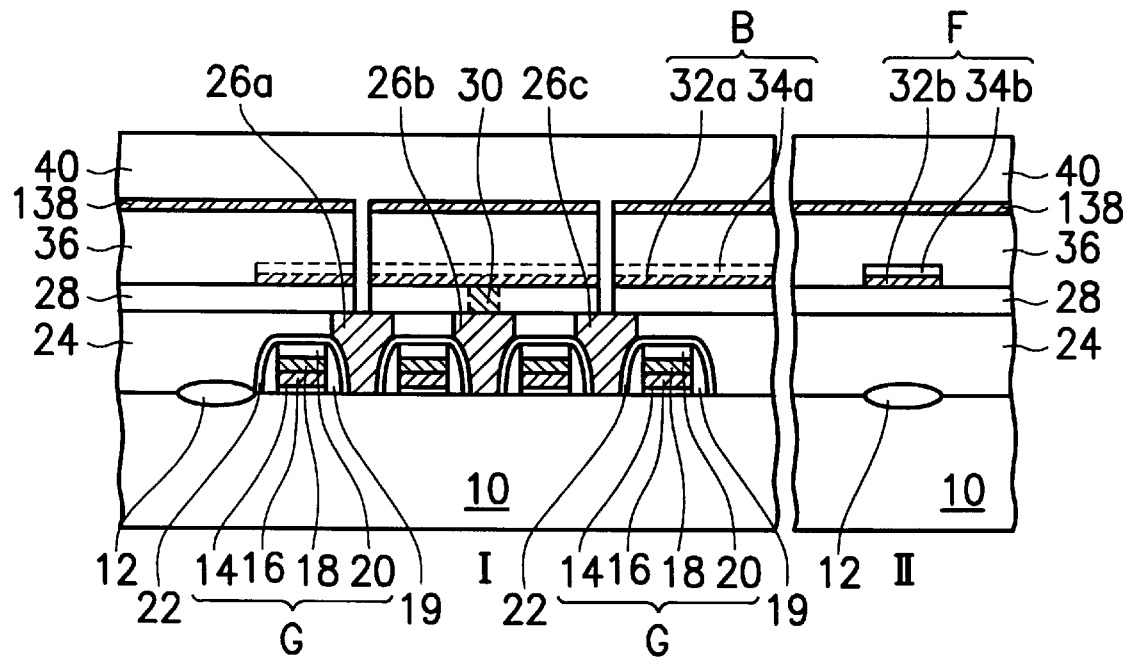

Referring now to FIG. 2D, the insulated layer 40 is deposited, for example, by chemical vapor deposition (CVD). The preferred thickness of the insulated layer 40 is usually in the range of approximately 8,000 to 12,000 angstroms.

Figure 2E:
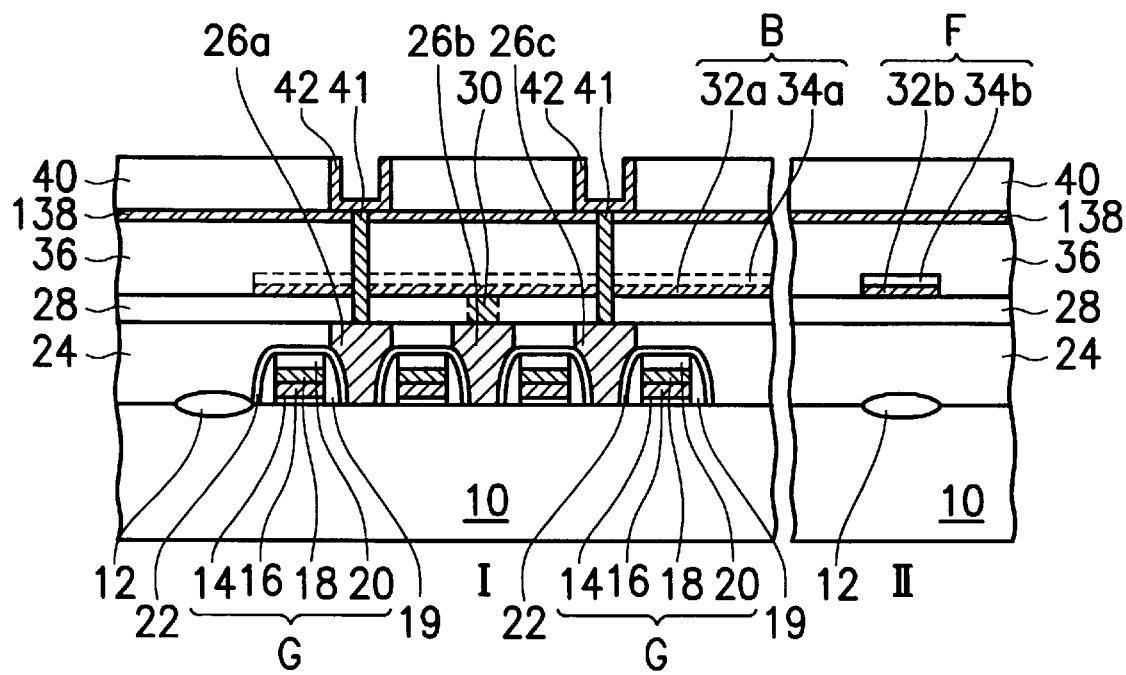

Now as shown in FIG. 2E, the trench is formed by selectively etching the insulated layer 40 in the position above the contact hole 39 to expose the etching stop layer 138, and the insulated layer 40 filled in the contact hole 39 is removed at the same time. The conductive material 41 is filled in the contact hole 39, and the conductive material 42 is deposited all over the side wall and the bottom of the trench. The conductive material 42, for example is a polysilicon, and serves as a lower electrode of a crown capacitor.

Figure 2F:
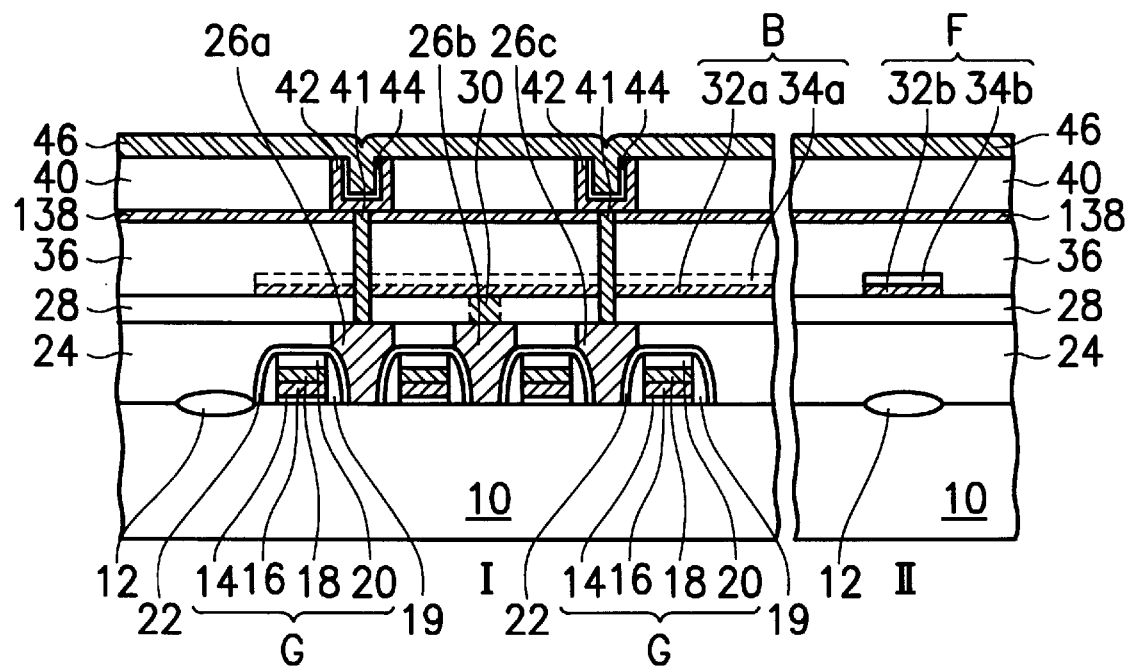

Referring to FIG. 2F, the thin dielectric layer 44 is formed on the conductive material 42. The dielectric layer 44 is for example a complex layer of oxide/nitride/oxide (ONO). The conductive layer 46, for example a polysilicon layer, is then deposited.

Figure 2G:
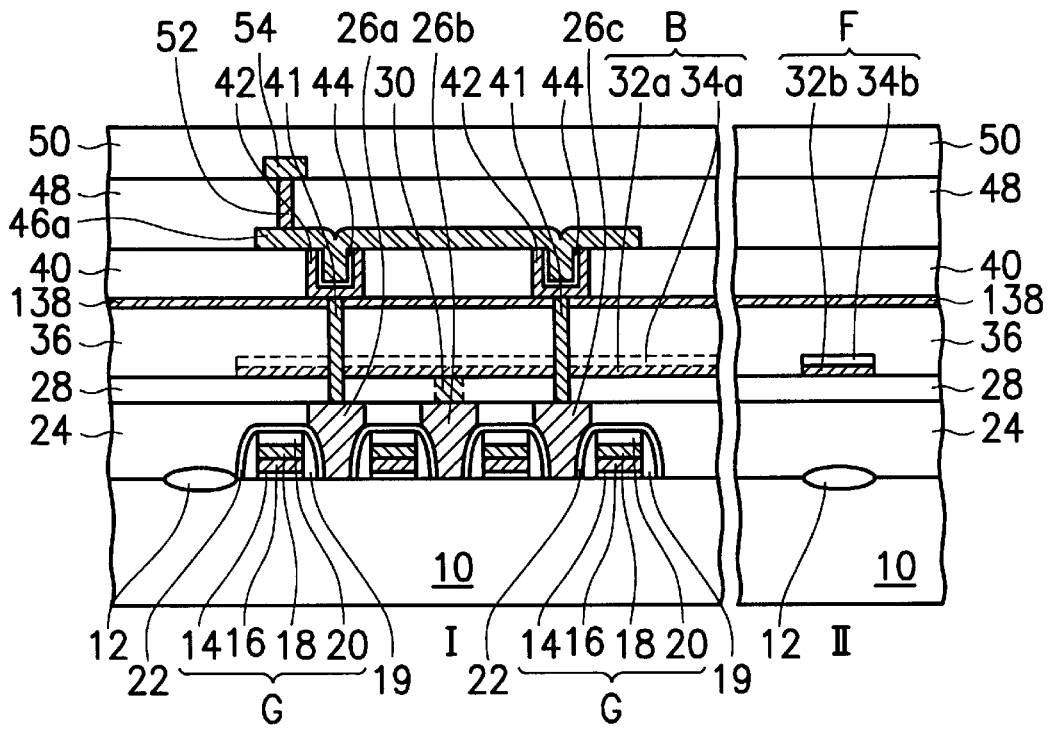

Next, referring to FIG. 2G, the conductive layer 46 is patterned to form an upper electrode 46a of the capacitor in the memory cell region I, typically by conventional photolithography techniques and anisotropic etching. Afterward, the oxide passivation layer 48 is formed to cover the upper electrode 46a. The conductive line 54 is formed on the oxide passivation layer 48, and connected with the upper electrode 46a via the metal plug 52. The oxide passivation layer 50 is then formed over the oxide passivation layer 48.

Figure 2H:
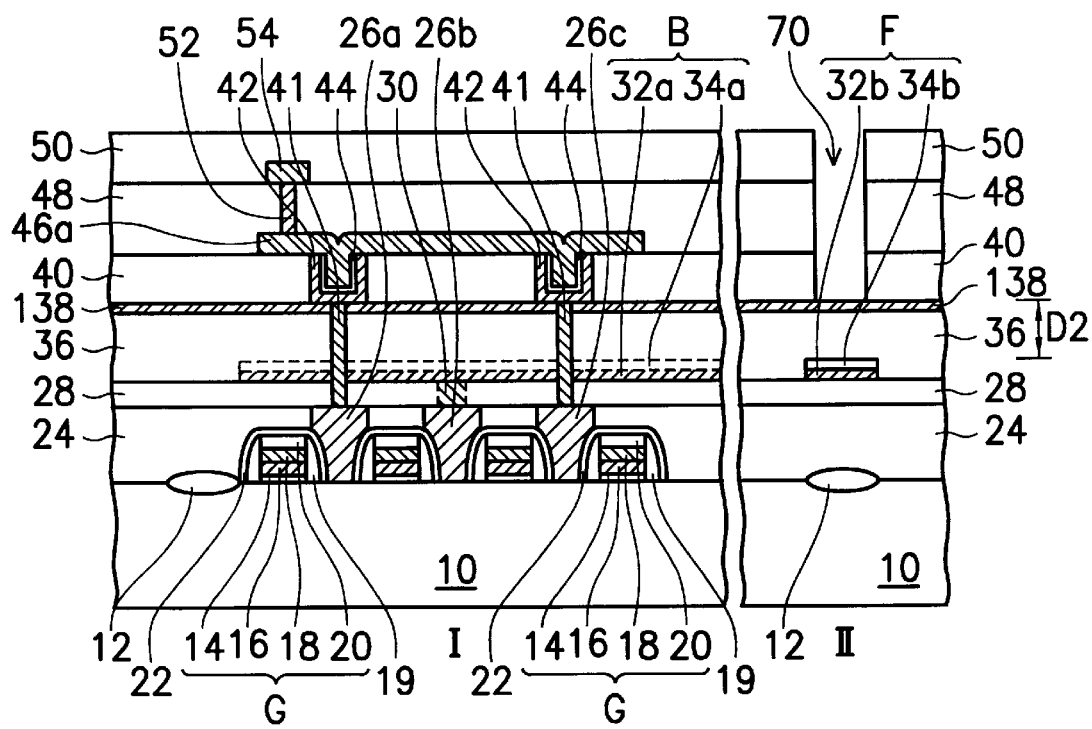

Finally, as shown in FIG. 2H, by utilizing etching stop layer 138 as a stop layer, the oxide passivation layer 50, 48, and insulated layer 40 are etched to form a trench 70 above the fuse F in the redundancy circuit region II, typically by conventional photolithography techniques and anisotropic etching.

The etching stop layer 138 is as an etching stop layer, when the etching step as depicted in FIG. 2H is carried out. The distance D2 between the trench 70 bottom and the fuse F is smaller than Di obtained in the conventional technique. Moreover, the laser-beam can pass through the layer 138 (silicon nitride). Therefore, the fuse F can be easily blown by the laser beam.

What is claimed is:

1. A method for manufacturing a DRAM having a redundancy circuit region, comprising the steps of:

(a) providing a semiconductor substrate having a memory cell region and a redundancy circuit region;

(b) forming a first insulated layer over said semiconductor substrate of said memory cell region and said redundancy circuit region;

(c) forming a first conductive layer on said first insulated layer to serve as a bit line in said memory cell region, and as a fuse in said redundancy circuit region;

(d) forming a second insulated layer over said first conductive layer of said memory cell region and said redundancy circuit region;

(e) forming an etching stop layer on said second insulated layer of said memory cell region and said redundancy circuit region;

(f) forming a lower electrode of the capacitor in said memory cell region;

(g) forming a dielectric layer on the surface of said lower electrode;

(h) forming a second conductive layer in said memory cell region and said redundancy circuit region;

(i) selectively etching said second conductive layer, to form an upper electrode of the capacitor in said memory cell region, and removing said second conductive layer in the redundancy circuit region; and (j) forming at least one passivation layer.

2. A method as claimed in claim 1, wherein said first insulated layer in the step (b) is a silicon oxide layer.

3. A method as claimed in claim 1, wherein said first conductive layer in the step (c) is a polysilicon layer.

4. A method as claimed in claim 1, wherein said first conductive layer in the step (c) is a complex layer consisting of a polysilicon and a polycide.

5. A method as claimed in claim 1, wherein said bit line and said fuse in the step (c) are formed by etching selectively said first conductive layer.

6. A method as claimed in claim 1, wherein said second insulated layer in the step (d) is a high-density plasma oxide layer.

7. A method as claimed in claim 1, wherein said etching stop layer in the step (e) is a silicon nitride layer.

8. A method as claimed in claim 7, wherein said silicon nitride layer has a thickness of somewhere between 1000 and 1500 Angstroms.

9. A method as claimed in claim 1, wherein said lower electrode in the step (f) consists of a polysilicon material.

10. A method as claimed in claim 1, wherein said dielectric layer in the step (g) consists of a ONO (oxide/nitride/oxide) material.

11. A method as claimed in claim 1, wherein said second conductive layer in the step (h) is a polysilicon layer.

12. A method as claimed in claim 1, wherein between the step (i) and (j) further comprise a step of forming a conductive line.

13. A method for manufacturing a DRAM having a redundancy circuit region, comprising the steps of:

(a) providing a semiconductor substrate having a memory cell region and a redundancy circuit region;

(b) forming a first insulated layer over said semiconductor substrate of said memory cell region and said redundancy circuit region;

(c) forming a polysilicon/polycide layer on said first insulated layer;

(d) selectively etching said polysilicon/polycide layer, to serve as a bit line in said memory cell region, and as a fuse in said redundancy circuit region;

(e) forming a second insulated layer over said polysilicon/polycide layer of said memory cell region and said redundancy circuit region;

(f) forming a laser beam permeable etching stop layer on said second insulated layer of said memory cell region and said redundancy circuit region;

(g) forming a crown lower electrode of the capacitor in said memory cell region;

(h) forming a dielectric layer on the surface of said lower electrode;

(i) forming a polysilicon layer in said memory cell region and said redundancy circuit region;

(j) selectively etching said polysilicon layer of said memory cell region, to form an upper electrode of the capacitor, and removing said polysilicon layer of the redundancy circuit region; and (k) forming at least one passivation oxide layer.

14. A method as claimed in claim 13, wherein said laser beam permeable etching stop layer is a silicon nitride layer.

15. A method as claimed in claim 1, wherein the step of forming an etching stop layer on said second insulated layer of said memory cell region and said redundancy circuit region occurs before the step of forming a lower electrode of the capacitor in said memory cell region.

16. A method as claimed in claim 13, wherein the step of forming a laser beam permeable etching stop layer on said second insulated layer of said memory cell region and said redundancy circuit region occurs before the step of forming a crown lower electrode of the capacitor in said memory cell region.

* * * * *